United States Patent
Roberts et al.

(10) Patent No.: US 7,308,656 B1
(45) Date of Patent: Dec. 11, 2007

(54) METHOD AND APPARATUS FOR GENERATING A BOUNDARY SCAN DESCRIPTION AND MODEL

(75) Inventors: Scott K. Roberts, Auburn, CA (US); Mark B. Roberts, Auburn, CA (US)

(73) Assignee: Xilinx, Inc., San Jose, CA (US)

( * ) Notice: Subject to any disclaimer, the term of this patent is extended or adjusted under 35 U.S.C. 154(b) by 238 days.

(21) Appl. No.: 11/243,713

(22) Filed: Oct. 4, 2005

(51) Int. Cl.
G06F 17/50 (2006.01)
G06F 11/22 (2006.01)
G01R 31/28 (2006.01)
G01R 31/3187 (2006.01)

(52) U.S. Cl. .................. 716/2; 716/3; 716/4; 703/16; 714/30; 714/33; 714/727; 714/734

(58) Field of Classification Search .................. 716/2, 716/3, 4; 703/16; 714/30, 33, 727, 734
See application file for complete search history.

(56) References Cited

U.S. PATENT DOCUMENTS

| | | | | |
|---|---|---|---|---|
| 5,862,152 A | * | 1/1999 | Handly et al. ............. | 714/727 |
| 6,425,100 B1 | * | 7/2002 | Bhattacharya ............. | 714/724 |
| 7,149,924 B1 | * | 12/2006 | Zorian et al. ............. | 714/30 |
| 7,174,486 B2 | * | 2/2007 | Adams et al. ............. | 714/710 |
| 2002/0178416 A1 | * | 11/2002 | Chen et al. ............. | 714/733 |
| 2002/0194558 A1 | * | 12/2002 | Wang et al. ............. | 714/718 |
| 2003/0110457 A1 | * | 6/2003 | Nadeau-Dostie et al. .... | 716/4 |
| 2003/0115522 A1 | * | 6/2003 | Nadeau-Dostie et al. .... | 714/726 |
| 2004/0039535 A1 | * | 2/2004 | Barth et al. ............. | 702/57 |
| 2004/0176924 A1 | * | 9/2004 | Salmon ............. | 702/125 |
| 2005/0229123 A1 | * | 10/2005 | Wang et al. ............. | 716/4 |

FOREIGN PATENT DOCUMENTS

JP 2000232163 A * 8/2000

OTHER PUBLICATIONS

Nordholz et al., "A Defect-Tolerant Word-Oriented Static RAM with Built-in Self-test and Selff-Reconfiguration", Proceedings of Eight Annual IEEE International Conference on Innovative Systems in Silicon, Oct. 9-11, 1996, pp. 124-132.*

* cited by examiner

Primary Examiner—Phallaka Kik
(74) Attorney, Agent, or Firm—Robert Brush (57) ABSTRACT

An aspect of the invention relates to a method, apparatus, and computer-readable medium for processing schematic data for an integrated circuit having a boundary scan architecture. A path through cells of the schematic data to generate a hierarchy of cells associated with a boundary scan chain. Each ignore cell in the hierarchy is pruned. Each short cell in the hierarchy is replaced with a direct connection. A shadow net is added to each net of the hierarchy. Each of the cells in the hierarchy is flattened in a bottom-up fashion.

20 Claims, 5 Drawing Sheets

METHOD AND APPARATUS FOR GENERATING A BOUNDARY SCAN DESCRIPTION AND MODEL

CROSS-REFERENCE TO A COMPUTER PROGRAM LISTING APPENDIX

This application includes a computer program listing appendix on a single compact disc, the contents of which are incorporated herein by reference in its entirety. The compact disc contains a first 8 KB file entitled "BSDL_TML1.TXT", a second 198 KB file entitled "BSDLNET1.TXT", a third 2 KB file entitled "JTAG_TML1.TXT" a fourth 71 KB file entitled "PACKAGE1.TXT", and a fifth, 11 KB file entitled "STARTUP1.TXT", all of which were created on Oct. 4, 2005. A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

One or more aspects of the present invention relate generally to computer-aided circuit design systems and, more particularly, to a method and apparatus for generating a boundary scan description and model.

BACKGROUND OF THE INVENTION

Boundary scan testing of integrated circuits is typically used to identify faulty connections, such as unconnected or shorted pins. Boundary scan tests allow designers to quickly identify manufacturing or layout problems, which could otherwise be nearly impossible to isolate, especially with high-count ball-grid array packages. In a typically testing scenario, test equipment or software is used to generate test vectors, which are then delivered to a boundary scan chain in the integrated circuit. The boundary scan chain includes various storage elements connected in a chain throughout the device. Output of the boundary scan chain is then monitored and compared to expected results. Exemplary boundary scan devices include, application specific integrated circuits (ASICs) and programmable logic devices (PLDs), such as field programmable gate arrays (FPGAs) and complex programmable logic devices (CPLDs).

A well-known boundary scan architecture is described in IEEE standard 1149.1, which is commonly known as JTAG (Joint Test Action Group). JTAG-compliant devices have dedicated hardware that includes a state machine and several storage elements (e.g., flip-flops or registers). This dedicated hardware interprets instructions and data provided by four dedicated signals. These signals are defined by the JTAG standard to be: test data in (TDI), test data out (TDO), test mode select (TMS), and test clock (TCK). The dedicated JTAG hardware interprets instructions and data on the TDI and TMS signals, and drives data out on the TDO signal. The TCK signal is used to clock the process.

Manufacturers of boundary scan devices typically provide a boundary scan description, which details the specific boundary scan architecture of the device. For example, manufacturers of a JTAG-compliant device provide a boundary scan description language (BSDL) file for that device. The BSDL file includes information on the function of each of the pins on the device (e.g., which pins are used as I/Os, which are power or ground, and the like), as well as the structure of the boundary scan chain. BSDL is a subset of VHDL (Very High Speed Integrated Circuit Hardware Description Language). One portion of a BSDL file describes the boundary scan chain within the device.

One previous methodology for generating a BSDL file for a device used a fully annotated schematic of the device having numerous tags that identify critical features related to the boundary scan architecture. The tags allowed for a process to extract the necessary information with respect to the boundary scan architecture from the annotated schematic in order to produce a BSDL file. The tags for the annotated schematic are typically added manually and are thus prone to error. Accordingly, there exists a need in the art for an improved method and apparatus for generating a boundary scan description and model for an integrated circuit.

SUMMARY OF THE INVENTION

An embodiment of the invention relates to a method, apparatus, and computer-readable medium for processing schematic data for an integrated circuit having a boundary scan architecture. A path through cells of the schematic data to generate a hierarchy of cells associated with a boundary scan chain. Each ignore cell in the hierarchy is pruned. Each short cell in the hierarchy is replaced with a direct connection. A shadow net is added to each net of the hierarchy. Each of the cells in the hierarchy is flattened in a bottom-up fashion.

In one aspect the final flattened boundary scan chain has only leaf cells, where a leaf cell includes a boundary scan register. In this aspect, an ignore cell is a circuit connected to the boundary scan register, but is not in the boundary scan chain. The ignore cell is configured to form an open circuit. Also in this aspect, a short cell is connected between two leaf cells and the short cell is configured to form a short circuit.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Figure 1:
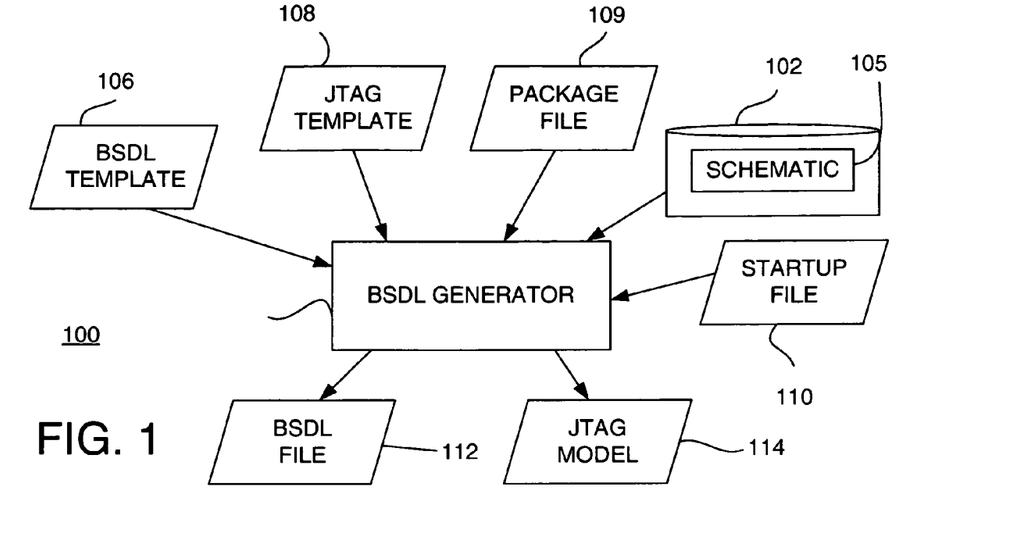
FIG. 1 is a block diagram depicting an exemplary embodiment of a system for generating a boundary scan description and model for an integrated circuit in accordance with one or more aspects of the invention.

FIG. 1 is a block diagram depicting an exemplary embodiment of a system 100 for generating a boundary scan description and model for an integrated circuit in accordance with one or more aspects of the invention. In one embodiment, the boundary scan description is a boundary scan description language (BSDL) file and the boundary scan model is a JTAG model. For purposes of clarity by example, the integrated circuit is described as being a field programmable gate array (FPGA). Those skilled in the art will appreciate that the invention may be used to generate a boundary scan description and model for other types of integrated circuits, such integrated circuits being application specific or otherwise.

The system 100 includes a schematic database 102 and a BSDL generator 104. The BSDL generator 104 is configured to receive a BSDL template 106, a JTAG template 108, a package file 109, and a startup file 110. The BSDL generator 104 is in communication with the schematic database 102. The schematic database 102 includes schematic data 105 for the FPGA. The BSDL generator 104 uses the BSDL template 106, the JTAG template 108, the package file 109, the startup file 110, and the schematic data 105 in the schematic database 102 as parametric input and generates a BSDL file 112 and a JTAG model 114 for the FPGA. The BSDL file 112 may be used by users of the FPGA who require knowledge of the boundary scan architecture. The JTAG model 114 may be used by users of the FPGA to generate test vectors. Operation of the system 100 may be understood with reference to the exemplary FPGA architecture and boundary scan architecture described immediately below with respect to FIGS. 2-4.

Figure 2:
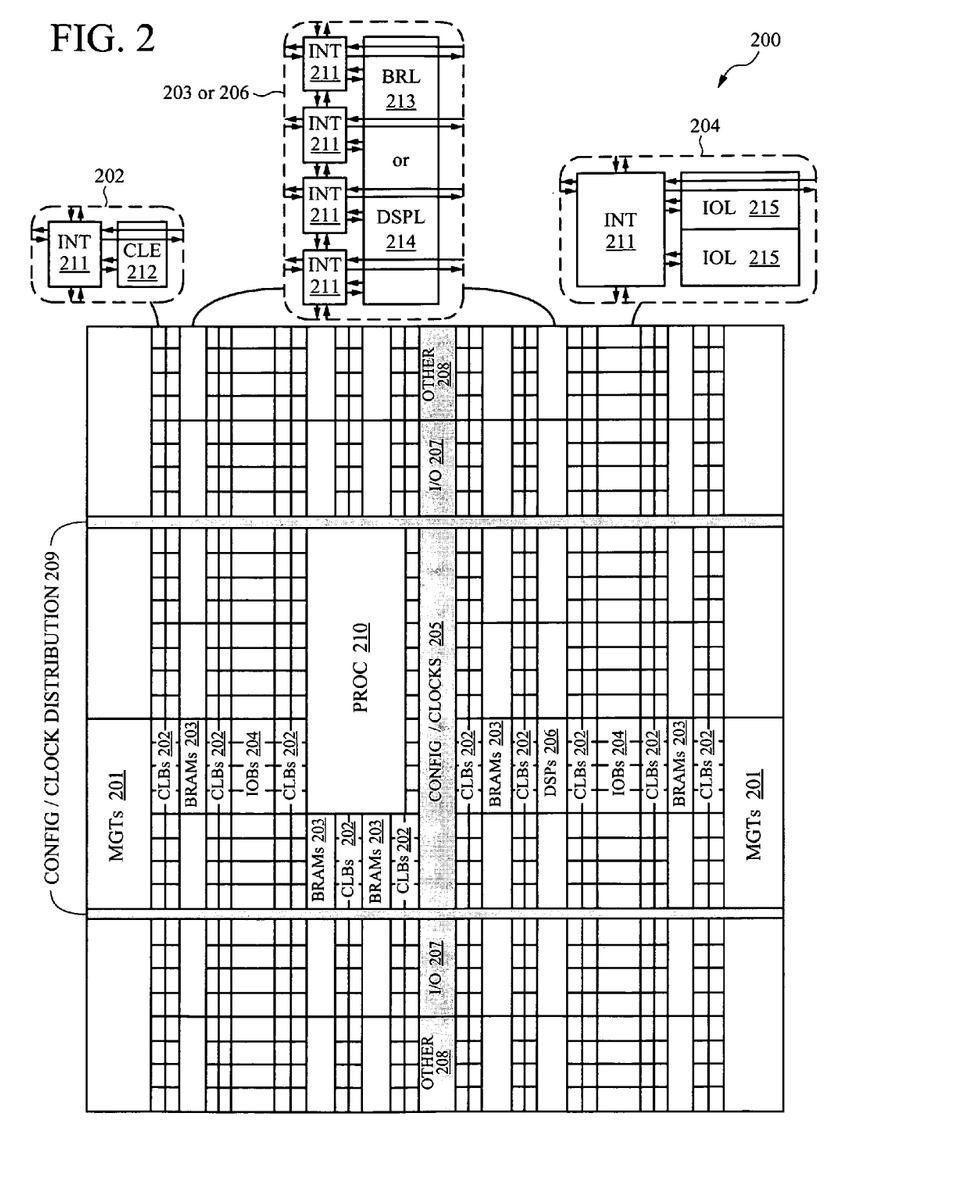
FIG. 2 illustrates an exemplary embodiment of an FPGA architecture in accordance with one or more aspects of the invention.

FIG. 2 illustrates an exemplary embodiment of an FPGA architecture 200 that includes a large number of different programmable tiles including multi-gigabit transceivers (MGTs 201), configurable logic blocks (CLBs 202), random access memory blocks (BRAMs 203), input/output blocks (IOBs 204), configuration and clocking logic (CONFIG/CLOCKS 205), digital signal processing blocks (DSPs 206), specialized input/output blocks (I/O 207) (e.g., configuration ports and clock ports), and other programmable logic 208 such as digital clock managers, analog-to-digital converters, system monitoring logic, and so forth. Some FPGAs also include dedicated processor blocks (PROC 210).

In some FPGAS, each programmable tile includes a programmable interconnect element (INT 211) having standardized connections to and from a corresponding interconnect element in each adjacent tile. Therefore, the programmable interconnect elements taken together implement the programmable interconnect structure for the illustrated FPGA. The programmable interconnect element (INT 211) also includes the connections to and from the programmable logic element within the same tile, as shown by the examples included at the top of FIG. 2.

For example, a CLB 202 can include a configurable logic element (CLE 212) that can be programmed to implement user logic plus a single programmable interconnect element (INT 211). A BRAM 203 can include a BRAM logic element (BRL 213) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 206 can include a DSP logic element (DSPL 214) in addition to an appropriate number of programmable interconnect elements. An IOB 204 can include, for example, two instances of an input/output logic element (IOL 215) in addition to one instance of the programmable interconnect element (INT 211). As will be clear to those of skill in the art, the actual I/O pads connected, for example, to the I/O logic element 315 are manufactured using metal layered above the various illustrated logic blocks, and typically are not confined to the area of the input/output logic element 215.

In the pictured embodiment, a columnar area near the center of the die (shown shaded in FIG. 2) is used for configuration, clock, and other control logic. Horizontal areas 209 extending from this column are used to distribute the clocks and configuration signals across the breadth of the FPGA.

Some FPGAs utilizing the architecture illustrated in FIG. 2 include additional logic blocks that disrupt the regular columnar structure making up a large part of the FPGA. The additional logic blocks can be programmable blocks and/or dedicated logic. For example, the processor block PROC 210 shown in FIG. 2 spans several columns of CLBs and BRAMs.

Note that FIG. 2 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 2 are purely exemplary. For example, in an actual FPGA more than one adjacent column of CLBs is typically included wherever the CLBs appear, to facilitate the efficient implementation of user logic.

Figure 3:
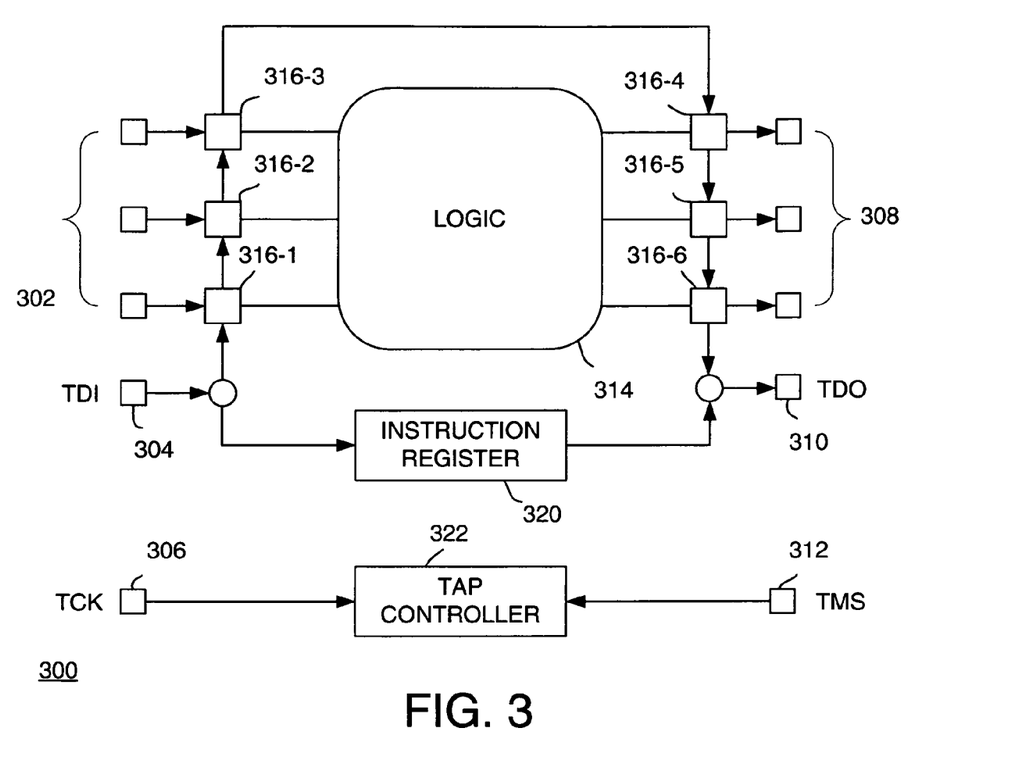
FIG. 3 is a block diagram depicting an exemplary embodiment of a boundary scan architecture for the FPGA in accordance with one or more aspects of the invention.

FIG. 3 is a block diagram depicting an exemplary embodiment of a boundary scan architecture 300 for the FPGA in accordance with one or more aspects of the invention. For purposes of clarity by example, the boundary scan architecture 300 is JTAG-compliant. The boundary scan architecture 300 includes input pads 302, a TDI pad 304, a TCK pad 306, output pads 308, a TDO pad 310, and a TMS pad 312. The boundary scan architecture 300 further includes logic 314, boundary scan cells 316-1 through 316-6, an instruction register 320, and a test access port (TAP) controller 322. Each of the boundary scan cells 316-1 through 316-3 is coupled to one of the input pads 302. Each of the boundary scan cell 316-4 through 316-6 is coupled to one of the output pads 308. The boundary scan cell 316-1 is coupled to the TDI pad 304, and the boundary scan cell 316-6 is coupled to the TDO pad 310. The boundary scan cells 316-1 through 316-6 are serially coupled to form a scan chain, referred to as boundary scan chain 316. Each of the boundary scan cells 316-1 through 316-6 is in communication with the logic 314. The logic 314 comprises, for example, the FPGA architecture 200 of FIG. 2.

The TAP controller 322 is coupled to the TCK pad 306 and the TMS pad 312. As is well known in the art, the TAP controller 322 is a state machine that controls operations associated with the boundary scan chain 316. Signals on the TCK pad 306 and the TMS pad 312 control transitions between states of the TAP controller 322. The TDI pad 304 receive input data for the boundary scan chain 316, and the TDO pad 310 provides output data for the boundary scan chain 316 under control of the TAP controller 322. The instruction register 320 is coupled to each of the TDI pad 304 and the TDO pad 310. The instruction register 320 is loaded through the TDI pad 304 with an instruction that determines which type of test to perform. Mandatory test types are detailed in the JTAG standard and are well known in the art.

Figure 4:
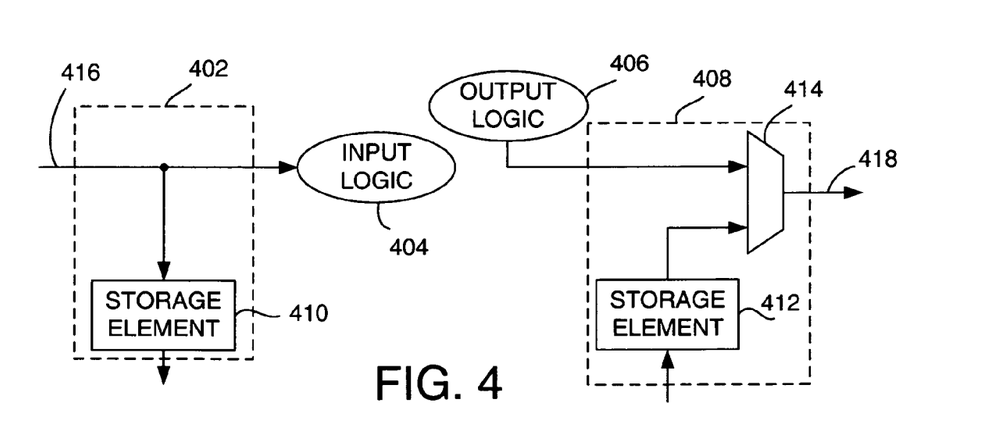
FIG. 4 is a block diagram depicting an exemplary embodiment of input/output pair of boundary scan cells for a boundary scan device in accordance with one or more aspects of the invention.

FIG. 4 is a block diagram depicting an exemplary embodiment of input/output pair of boundary scan cells for a boundary scan device in accordance with one or more aspects of the invention. An input boundary cell 402 includes a storage element 410, such as a flip-flop or register. The storage element 410 is coupled to another storage element in another cell of the scan chain (not shown). An output boundary cell 408 includes a storage element 412 (e.g., flip-flop or register) and a multiplexer 414. The storage element 412 is coupled to another storage element of another cell of the scan chain (not shown). An input pad 416 of the device is coupled to both the storage element 410 and input logic 404. A first input terminal of the multiplexer 414 is coupled to an output terminal of output logic 406, and a second input terminal of the multiplexer 414 is coupled to an output terminal of the storage element 412. An output of the multiplexer 414 is coupled to an output pad 418 of the device.

During standard operation, the boundary cells 402 and 408 are inactive and allow data to be propagated through the device normally. That is, input data is received by the input pad 416 and processed by the input logic 404. The multiplexer 414 selects output produced by the output logic 406, which is provided via the output out 418. During test modes, all input signals at the input pad 416 are captured by the input boundary cell 402 for analysis. The multiplexer 414 selects output produced by the storage element 412. For purposes of clarity by example, the input cell 402 is shown with a single storage element, and the output cell 408 is shown with a single storage element and a multiplexer. Those skilled in the art will appreciate that a boundary scan cell may include one or more storage elements and other types of control logic, as is well known in the art.

Returning to FIG. 1, the schematic data 105 in the schematic database 102 may include a gate level netlist. The gate-level netlist is formed of a collection of constructs, known as standard cells, and the connections between them, known as nets. Some of these constructs may be part of a standard-cell library comprising pre-characterized collections of gates. Notably, the gate-level netlist includes boundary scan cells that form the boundary scan chain. The gate level netlist may be synthesized from a register transfer level (RTL) description of the FPGA written using a hardware description language (HDL), as is well known in the art.

The BSDL template 106 includes an outline of a BSDL file with various variables that are to be replaced by the BSDL generator 104 to generate the BSDL file 112. An exemplary portion of a BSDL template is shown below, where the "%" tokens indicate the variables to be replaced:

a. entity % ENTITYNAME % is
b. generic (PHYSICAL_PIN_MAP: string:="% PACKAGENAME %");
c. port (% PORTLIST %)
d. attribute BOUNDARY_REGISTER of % ENTITYNAME %: entity is
e. % BOUNDARYREGISTER %

An example of a complete BSDL template is shown in the file "BSDL_TML1.TXT" of the computer program listing appendix, which is herein incorporated by reference. Notably, other types of tokens may be used to indicate variables in the template.

The JTAG template 108 includes an outline of a JTAG model, with various variables that are to be replaced by the BSDL generator 104 to generate the JTAG model 114. The JTAG template 108 may be expressed in HDL, such as VERILOG. The variables may be indicated using a predefined token, such as "%" tokens similar to the BSDL template 106. An example of a complete JTAG template is shown in the file "JTAG_TML1.TXT" of the computer program listing appendix, which is herein incorporated by reference. The startup file 110 includes customizations specific to the FPGA design, such as pad mapping, pads to ignore, pin-to-pad mapping, a port list, and parameters such as configuration bitstream length, where to find the IDCODE, and where to find the package file 109. The package file 109 includes pin to pad mapping data. The startup file 110 also includes information to assist in tracing connectivity of the boundary scan chain, such as definition of cells to short and open, starting point to trace (e.g., TDI), and identification of "leaf" cells. As described below, an embodiment of the invention advantageously divides the cells of the FPGA design into four types: leaf cells, short cells, ignore cells, and hierarchical cells. The leaf, short, and ignore cells are specified in the startup file 110. All other cells in the design are assumed to be hierarchical cells. An example of a complete startup file is shown in the file "STARTUP1.TXT" of the computer program listing appendix, which is herein incorporated by reference. An example of a package file is shown in the file "PACKAGE1.TXT" of the computer program listing appendix, which is herein incorporated by reference.

Figure 5:
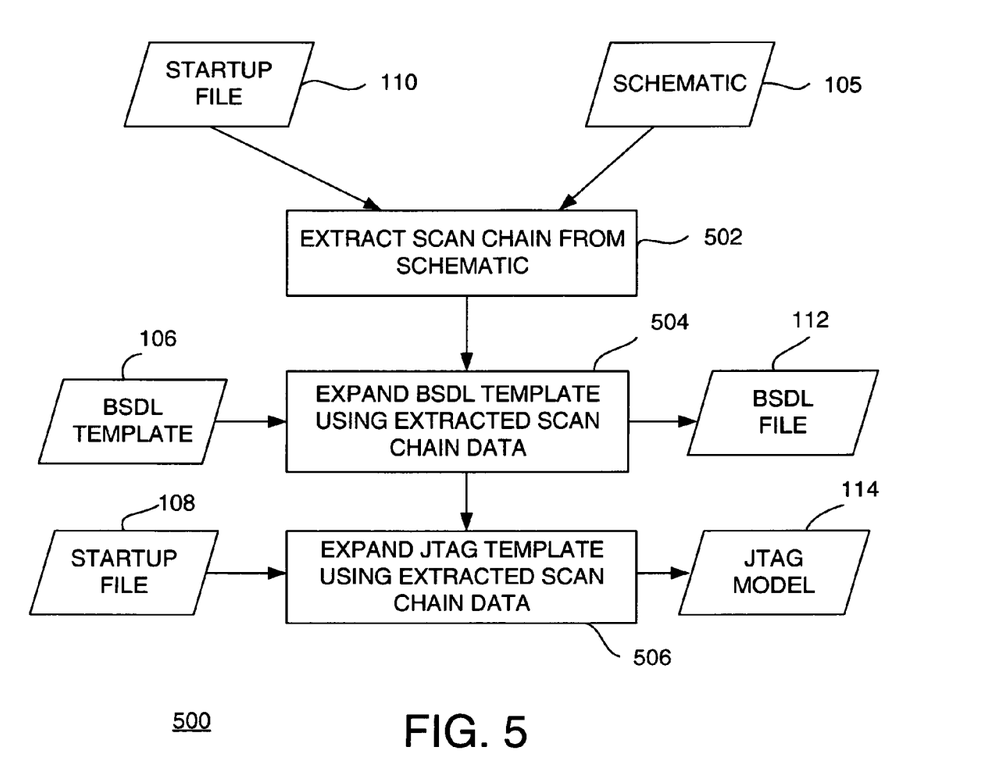
FIG. 5 is a flow diagram depicting an exemplary embodiment of a method for generating a boundary scan description and model for an integrated circuit in accordance with one or more aspects of the invention.

FIG. 5 is a flow diagram depicting an exemplary embodiment of a method 500 for generating a boundary scan description and model for an integrated circuit in accordance with one or more aspects of the invention. The method 500 is executed by the BSDL generator 104 of FIG. 1. The method 500 begins at step 502, where the boundary scan chain is extracted from the schematic data 105 using the startup file 110 as parametric input. As described below, the extracted scan chain data comprises a flat netlist (i.e., a netlist without hierarchical description). An exemplary embodiment of a method of extracting the scan chain is described below with respect to FIG. 6. At step 504, the BSDL file 112 is generated by expanding the BSDL template 106 using the extracted scan chain data. Notably, information is extracted from the flattened netlist to replace the variables of the BSDL template 106 with actual values associated with boundary scan architecture of the FPGA.

At step 506, the JTAG model 114 is generated by expanding the JTAG template 108 using the extracted scan chain data. Information is extracted from the flattened netlist to replace the variables of the JTAG template 108 with actual values associated with the boundary scan architecture of the FPGA. Notably, steps 504 and 506 may be performed contemporaneously. That is, the BSDL file 112 and the JTAG model 114 may be generated at substantially the same time or in sequence. Exemplary program code written in the C programming language for implementing the method 500 and operation of the BSDL generator is shown in the file "BSDLNET1.TXT" of the computer program listing appendix, which is herein incorporated by reference.

Figure 6:
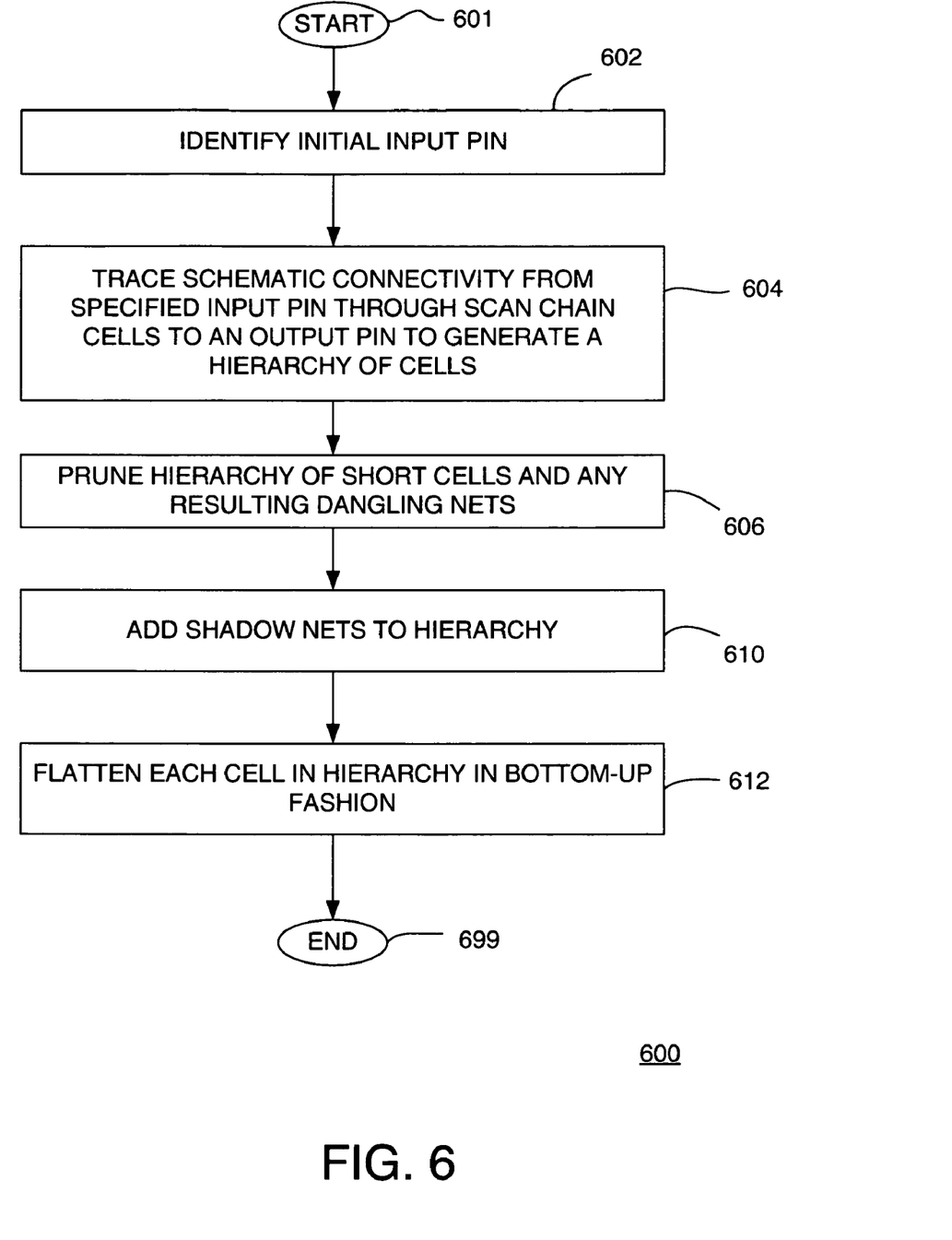
FIG. 6 is a flow diagram depicting an exemplary embodiment of a method for extracting a scan chain from schematic data in accordance with one or more aspects of the invention.

FIG. 6 is a flow diagram depicting an exemplary embodiment of a method 600 for extracting a scan chain from schematic data in accordance with one or more aspects of the invention. The method 600 begins at step 601. At step 602, the initial input pin is identified. In one embodiment, the initial input pin is specified in the startup file 110 (e.g., the TDI pin). At step 604, schematic connectivity is traced from the specified input pin through the scan chain cells to an output pin to generate a hierarchy of cells for the scan chain. The default output pin is the TDO pin. That is, a path is traced through the cells of the schematic data to generate a hierarchy of cells associated with the boundary scan chain.

To keep the tracing of a path through the boundary scan chain of the FPGA design on track, leaf cells, ignore cells, and short cells are defined. The leaf cells are the primitive cells in the schematic hierarchy. Typically, the leaf cells are part of a standard library of cells used in the FPGA design. The short cells are similar to leaf cells except they will be dropped from the final BSDL netlist. The logical pins that pass connectivity from one side of a cell to the other are specified at the same time that the leaf and short cells are defined in the startup file 110. For example, the startup file 110 may include the following:

leaf_cell="XI_CompLib bs_bc_1 SI PI SO PO"

The "leaf_cell" keyword tags this cell as a leaf cell. The library "XI_CompLib" and cell name "bs_bc_1" are then specified to identify the cell. Finally, a list of logical pins is specified that will be used to continue the connectivity tracing when this cell is found on the path. A hierarchical data structure is created as the scan chain is traversed. The hierarchical data structure contains only the cells (leaf, short, ignore, and hierarchical) in the path and the connectivity between them. This greatly reduces the amount of information that needs to be processed, as compared to the entire schematic of the FPGA design. Leaf cells stop the hierarchical traversal into the leaf cell (which may not be primitive in the original schematic), but allows traversal to continue across the pins of the leaf cell. Leaf cells are included in the hierarchical data structure. Short cells may be specified similarly to leaf cells. Short cells are initially included in the hierarchical data structure, but later on they are pruned away. Ignore cells may be specified similarly to leaf and short cells, except a list of logical pins is not needed, since the connectivity does not continue across an ignore cell. Ignore cells are not included in the hierarchical data structure.

At step 606, the hierarchy is pruned of short cells and any resulting dangling nets. A "dangling net" is a net that is no longer connected to any cell due to the pruning of a short cell. Short cells are removed from the hierarchy and replaced with direct connections. This can result in a direct short (a feedthru) between two logical pins of a hierarchical cell. In one embodiment, this is handled by "promoting" the connection to the next level of the hierarchy and deleting one (or if there is no additional internal connection, both) of the logical pins.

At step 610, shadow nets are added to the hierarchy. A "shadow net" is a copy of the original net with a link between the two nets. At step 612, each cell in the hierarchy is flattened in a bottom-up fashion. By flattening the hierarchy in a bottom-up fashion, a particular cell is only flattened once. If another instance of a previously flattened cell is found in the hierarchy, the flattened information is copied without having to go through each path of the cell again. In addition, the connections from one level of the hierarchy to the next are made through the shadow nets. This allows for direct traversal to the shadow net without having to search for it when connections are made between one level of the hierarchy and the next. Notably, connection from one level of the hierarchy to the next lower level is made by going from a net to one of its' connected instance pins; the pin of the instance is associated with a port of the master cell associated with that instance; and the port is connected to a net inside that cell. In this way, a net at one level of the hierarchy is connected to a net at a lower level of the hierarchy. By associating a shadow net to each net in the hierarchy, the hierarchical net traversal process can be exploited during the flattening process to connect flat nets together. Note that shadow nets are absorbed by flat nets as these connections are made. In this manner, the process of flattening the hierarchy is more efficient than visiting each node in a directed graph as specified by the hierarchy. The method 600 ends at step 699.

As indicated by step 604 above a hierarchy of cells is generated having the scan chain cells. All cells are classified as one of 4 types: ignore, short, leaf or hierarchical. The hierarchical cells are those cells that contain instances of other cells. The remaining cell types describe primitive cells that do not contain any instances of other cells. For the final BSDL netlist, hierarchical cells are flattened and so do not appear directly in the netlist. Only the leaf cells are kept in the final BSDL netlist. The leaf cells show the connectivity of the network trace and include the scan chain cells. The short and ignore cells are dropped from the final BSDL netlist. The short cells provide a method of continuing the connectivity (i.e., creating a short circuit), without appearing as an instance in the final BSDL netlist. Before dropping the short cells, connectivity is established between the declared ports of the short cell. The ignore cells provide a method to halt the connectivity (i.e., creating an open circuit) and are simply dropped when forming the final BSDL netlist.

As an illustration of creating the final BSDL net list and with reference to the STARTUP1.txt file, a final BSDL netlist is basically made up of instances of only 2 boundary register cell types: bs_bc_1 and bs_bc_2, which are leaf cells for this example. In other words, the final BSDL netlist traces the connectivity from one scan chain register (of type bs_bc_1 or bs_bc_2) to another scan chain register (of type bs_bc_1 or bs_bc_2), all the way around the chip. So, the problem is how to trace that connectivity and ignore everything else. This problem is solved with the short and ignore cells. For example, the net coming out of a bs_bc_2 register cell may connect several cells together. But the only cell that we are interested in is the next bs_bc_2 register cell in the scan chain. So, the other connected cells are set to be ignore cells. That way they do not appear in the final BSDL netlist (i.e., they are deleted). The STARTUP1.txt file lists these ignore cells, and some example ignore cells are the clb and the ppc cells. Although these ignore cells are large blocks of the design, there are also some small cells like the no connection symbol "noConn" that also need to be ignored. Now, sometimes a cell is interposed between registers, for example, a buffer or an inverter. In this case, it is important that the connectivity does not stop at this device. So the cell cannot be ignored. However, it is not considered a part of the scan chain either. So, it cannot be included in the final BSDL netlist. Therefore, it is declared as a SHORT cell (for example: xi_inv or xi_nor2 in the STARTUP1.txt file). The connection between scan chain registers is thus maintained, but the cell is not included in the final BSDL netlist.

Thus, the short and ignore cells are used to handle cells that appear in the design (and are connected in some way to the scan chain), but should not appear in the final BSDL netlist. Ignore cells halt tracing of the connectivity, while short cells allow tracing of the connectivity to continue.

Some embodiments of the invention are program products containing machine-readable programs. The program(s) of the program product defines functions of the embodiments and can be contained on a variety of signal/bearing media, which include, but are not limited to: (i) information permanently stored on non-writable storage media (e.g., readonly memory devices within a computer such as CD-ROM disks readable by a CD-ROM drive); (ii) alterable information stored on writable storage media (e.g., floppy disks within a diskette drive or hard-disk drive); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct the functions of the present invention, represent embodiments of the present invention.

Figure 7:
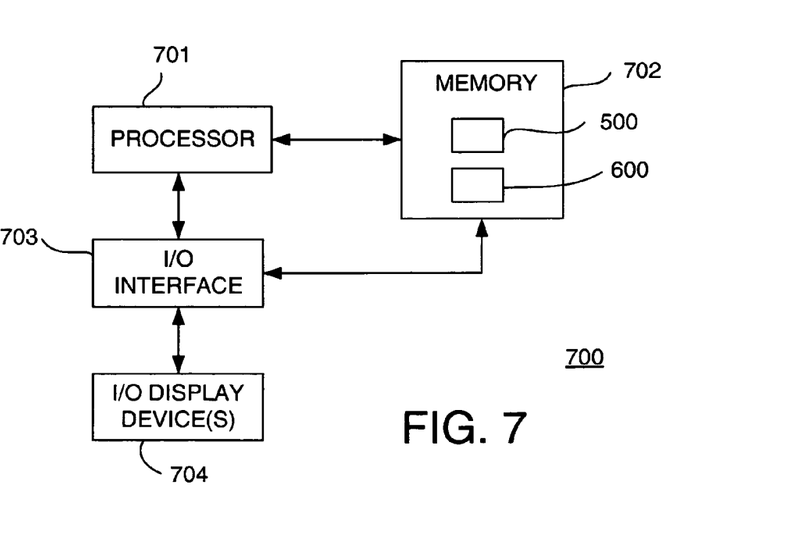
FIG. 7 is a block diagram depicting an exemplary embodiment of a programmed computer system in accordance with one or more aspects of the invention.

FIG. 7 is a block diagram depicting an exemplary embodiment of a programmed computer system 700 in accordance with one or more aspects of the invention. The computer system 700 includes a processor 701, a memory 702, one or more input/output (I/O) interface(s) 703, and one or more I/O display device(s) 704 in communication with one another. The memory 702 may comprise volatile and/or non-volatile memory, including but not limited to magnetically readable memory (e.g., floppy disk, hard disk, and the like), optically readable memory (e.g., CD, DVD, and the like), and electrically readable memory (e.g., DRAM, SRAM, EEPROM, registers, latches, and the like). Though the memory 702 is illustratively shown as a single block, it should be understood that the memory 702 may comprise a plurality of elements existing at one or more levels of access with respect to the processor 701.

Some embodiments of the present invention are program products that may reside in whole or in part in the memory 702. By way of example and not limitation, the memory 702 may comprise DRAM sufficient to hold at least a program representative of the processes 500 and 600 and derivatives thereof as set forth herein.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

We claim:

1. A method of processing schematic data for an integrated circuit having a boundary scan architecture, comprising:
    tracing a path through cells of the schematic data to generate a hierarchy of cells associated with a boundary scan chain;
    pruning each ignore cell in the hierarchy;
    replacing each short cell in the hierarchy with a direct connection;
    adding a shadow net to each net of the hierarchy; and
    flattening each of the cells in the hierarchy in a bottom-up fashion.

2. The method of claim 1, further comprising:
    receiving a startup file identifying ignore cells and short cells in the cells of the schematic data, and
    wherein an ignore cell is configured to form an open circuit and a short cell is configured to form a short circuit.

3. The method of claim 2, wherein the startup file further identifies leaf cells in the cells of the schematic data, wherein a leaf cell comprises a boundary scan register.

4. The method of claim 2, wherein the startup file identifies an initial input pin of the integrated circuit, and wherein the path through the cells begins at the initial input pin.

5. The method of claim 1, wherein the step of flattening comprises:
    flattening only one instance of each of the cells in the hierarchy; and
    copying flattened information for each duplicate instance of the cells in the hierarchy.

6. The method of claim 1, further comprising:
    receiving a boundary scan description template; and
    expanding the boundary scan description template using information from the hierarchy as flattened to generate a boundary scan description.

7. The method of claim 6, further comprising:
    receiving a JTAG template; and
    expanding the JTAG template using information from the hierarchy as flattened to generate a JTAG model.

8. A computer readable medium having stored thereon instructions that, when executed by a processor, cause the processor to perform a method of processing schematic data for an integrated circuit having a boundary scan architecture, comprising:
    tracing a path through cells of the schematic data to generate a hierarchy of cells comprising one or more leaf cells associated with a boundary scan chain;
    pruning each ignore cell in the hierarchy, an ignore cell comprising a first circuit connected to a first leaf cell, where the first circuit is not part of the boundary scan chain;
    replacing each short cell in the hierarchy with a direct connection, a short cell comprising a second circuit coupled between two leaf cells; and
    flattening each hierarchical cell in the hierarchy.

9. The computer readable medium of claim 8, wherein the method further comprising:
    receiving a startup file identifying ignore cells and short cells in the cells of the schematic data.

10. The computer readable medium of claim 9, wherein the startup file further identifies leaf cells in the cells of the schematic data.

11. The computer readable medium of claim 9, wherein the startup file identifies an initial input pin of the integrated circuit, and wherein the path through the cells begins at the initial input pin.

12. The computer readable medium of claim 8, wherein the step of flattening comprises:
    flattening only one instance of each of the cells in the hierarchy; and
    copying flattened information for each duplicate instance of the cells in the hierarchy.

13. The computer readable medium of claim 8, wherein the method further comprising:
    receiving a boundary scan description template; and
    expanding the boundary scan description template using information from the hierarchy as flattened to generate a boundary scan description.

14. The computer readable medium of claim 13, wherein the method further comprising:
    receiving a JTAG template; and
    expanding the JTAG template using information from the hierarchy as flattened to generate a JTAG model.

15. A system, comprising:
  a database for storing schematic data for an integrated circuit having a boundary scan architecture;
  a generator for tracing a path through cells of the schematic data to generate a hierarchy of cells associated with a boundary scan chain, pruning each ignore cell in the hierarchy, replacing each short cell in the hierarchy with a direct connection, addition a shadow net to each net of the hierarchy, and flattening each of the cells in the hierarchy in a bottom-up fashion.

16. The system of claim 15, wherein the generator is further configured to receive a startup file identifying ignore cells and short cells in the cells of the schematic data.

17. The system of claim 16, wherein the startup file further identifies leaf cells in the cells of the schematic data.

18. The system of claim 16, wherein the startup file identifies an initial input pin of the integrated circuit, and wherein the path through the cells begins at the initial input pin.

19. The system of claim 15, wherein the generator is further configured to:
  flatten only one instance of each of the cells in the hierarchy; and
  copy flattened information for each duplicate instance of the cells in the hierarchy.

20. The system of claim 15, wherein the generator is further configured to:
  receive a boundary scan description template;
  expand the boundary scan description template using information from the hierarchy as flattened to generate a boundary scan description;
  receive a JTAG template; and
  expand the JTAG template using information from the hierarchy as flattened to generate a JTAG model.

* * * * *